United States Patent
Wiktor et al.

(10) Patent No.: US 10,892,769 B2
(45) Date of Patent: Jan. 12, 2021

(54) ANALOG-TO-DIGITAL CONVERTER WITH HYSTERESIS

(71) Applicant: TEXAS INSTRUMENTS INCORPORATED, Dallas, TX (US)

(72) Inventors: Stefan Wlodzimierz Wiktor, Raleigh, NC (US); Brian Thomas Lynch, Brookline, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/587,767

(22) Filed: Sep. 30, 2019

(65) Prior Publication Data
US 2020/0228131 A1 Jul. 16, 2020

Related U.S. Application Data
(60) Provisional application No. 62/791,920, filed on Jan. 14, 2019.

(51) Int. Cl.
| | | |
|---|---|---|
| *H03M 1/12* | (2006.01) | |
| *H03M 1/36* | (2006.01) | |
| *H03K 3/0233* | (2006.01) | |
| *H03K 3/017* | (2006.01) | |

(52) U.S. Cl.
CPC .......... *H03M 1/1205* (2013.01); *H03K 3/017* (2013.01); *H03K 3/02337* (2013.01); *H03M 1/368* (2013.01)

(58) Field of Classification Search
CPC .... H03M 1/1205; H03M 1/368; H03K 3/017; H03K 3/02337

USPC .............. 341/155–172; 327/205, 206, 68, 73
See application file for complete search history.

(56) References Cited

U.S. PATENT DOCUMENTS

| | | | | | |
|---|---|---|---|---|---|
| 4,194,186 | A | * | 3/1980 | Morrison ............ | H03M 1/1014 341/118 |
| 5,006,853 | A | * | 4/1991 | Kiriaki ................... | H03M 1/14 341/156 |
| 5,153,462 | A | * | 10/1992 | Agrawal .................. | G06J 1/00 326/39 |
| 5,264,740 | A | * | 11/1993 | Wright ............... | H03K 3/02337 327/63 |
| 5,610,545 | A | * | 3/1997 | Jenkins .............. | H03K 3/02337 327/205 |
| 5,617,050 | A | * | 4/1997 | Jenkins .............. | H03K 3/02337 327/205 |

(Continued)

OTHER PUBLICATIONS
PCT Search Report dated Apr. 23, 2020.

*Primary Examiner* — Lam T Mai
(74) *Attorney, Agent, or Firm* — Lawrence J. Bassuk; Charles A. Brill; Frank D. Cimino

(57) ABSTRACT

A circuit includes an analog-to-digital converter (ADC) and a hysteresis circuit. The ADC is configured to generate a series of digital codes. The hysteresis circuit is configured to: (a) determine that a first digital code of the series of digital codes represents a change in a same direction as previous digital codes and store the first digital code in the register; and (b) determine that a second digital code of the series of digital codes represents a change in direction from previous digital codes, determine that the second digital code is less than a hysteresis value different than a preceding digital code, and not store the second digital code in the register.

20 Claims, 7 Drawing Sheets

(56) References Cited

U.S. PATENT DOCUMENTS

| | | | |
|---|---|---|---|
| 5,630,221 A * | 5/1997 | Birleson | G01S 7/34 |
| | | | 341/139 |
| 6,208,277 B1 * | 3/2001 | Hellums | B82Y 10/00 |
| | | | 341/133 |
| 8,164,504 B2 | 4/2012 | Cho | |
| 9,306,548 B1 | 4/2016 | Wiktor et al. | |
| 9,991,777 B2 | 6/2018 | Lynch et al. | |
| 2005/0184762 A1 * | 8/2005 | Yuki | H03K 5/2481 |
| | | | 327/77 |
| 2009/0302938 A1 | 12/2009 | Andersen | |
| 2010/0246221 A1 * | 9/2010 | Sahu | H02M 3/1584 |
| | | | 363/78 |
| 2015/0188561 A1 | 7/2015 | Narayan | |
| 2015/0349757 A1 * | 12/2015 | Chen | H03K 3/3565 |
| | | | 327/206 |
| 2018/0026648 A1 * | 1/2018 | Kris | H03K 5/14 |
| | | | 341/155 |
| 2019/0068215 A1 * | 2/2019 | Lesso | H03M 3/376 |

\* cited by examiner

ANALOG-TO-DIGITAL CONVERTER WITH HYSTERESIS

CROSS-REFERENCE TO RELATED APPLICATIONS

This application claims priority to U.S. Provisional Application No. 62/791,920, filed Jan. 14, 2019, which is hereby incorporated by reference.

BACKGROUND

An analog-to-digital converter (ADC) converts an analog signal to a digital code. An inherent behavior of an ADC is least significant bit (LSB) jitter during the analog-to-digital conversion process. LSB jitter is generally of no concern in applications in which averaging techniques can be applied. However, using ADC and its inherent LSB jitter in the control process of, for example, setting a direct current (DC)-to-DC converter's duty cycle will result in observable converter output voltage oscillation. In some applications, averaging techniques are not useful because of latency introduced by the averaging process itself.

SUMMARY

In one example, a circuit includes an analog-to-digital converter (ADC) and a hysteresis circuit. The ADC is configured to generate a series of digital codes. The hysteresis circuit is configured to: (a) determine that a first digital code of the series of digital codes represents a change in a same direction as previous digital codes and store the first digital code in the register; and (b) determine that a second digital code of the series of digital codes represents a change in direction from previous digital codes, determine that the second digital code is less than a hysteresis value different than a preceding digital code, and not store the second digital code in the register.

BRIEF DESCRIPTION OF THE DRAWINGS

For a detailed description of various examples, reference will now be made to the accompanying drawings in which.

DETAILED DESCRIPTION

The disclosed examples pertain to an ADC that includes hysteresis for determining the LSB of the output digital code from the ADC. One example use of the ADC with hysteresis control is within a switching regulator as described below.

Figure 1:
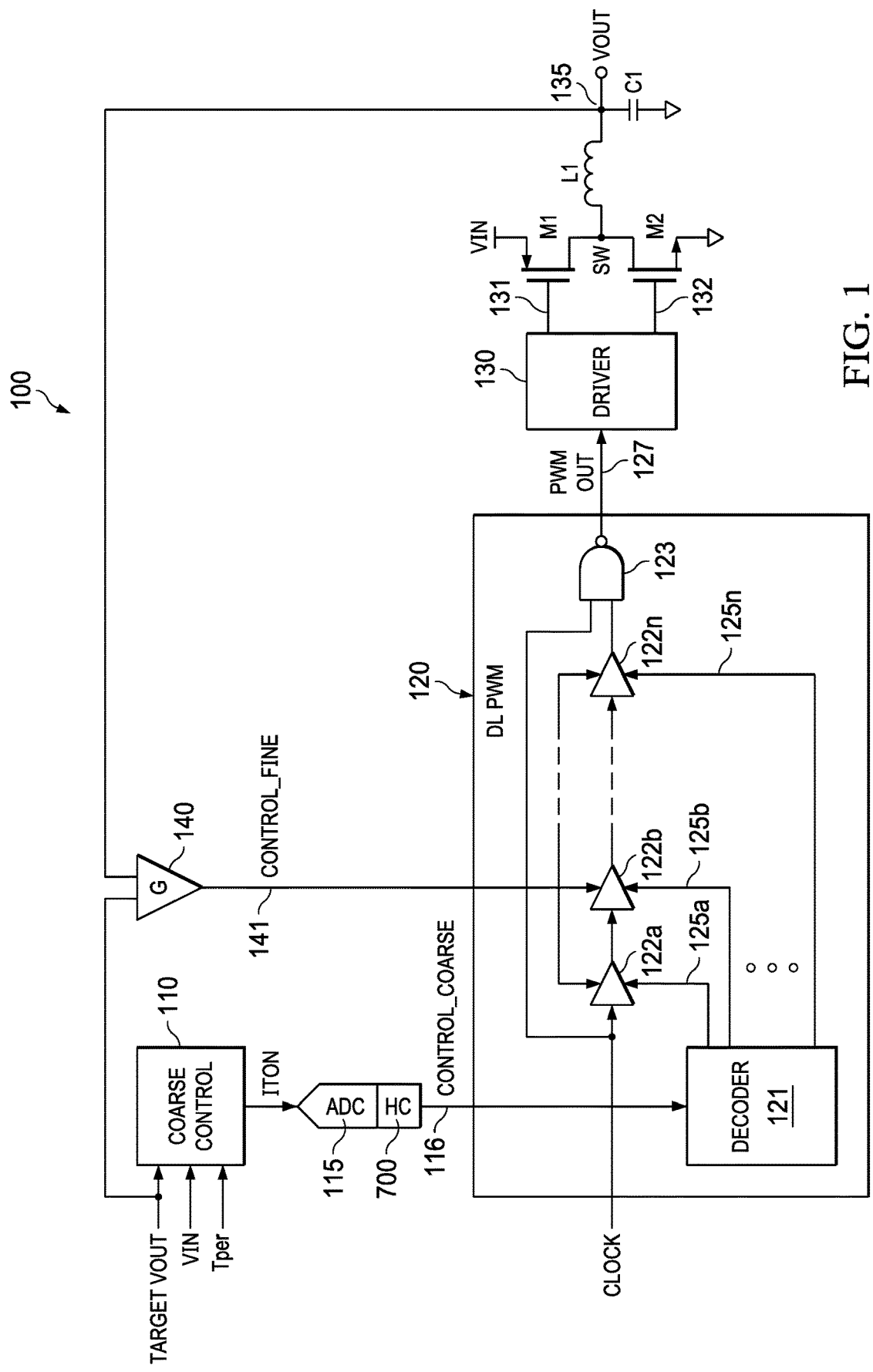
FIG. 1 illustrates an example of a switching voltage regulator including an analog-to-digital converter (ADC) that employs hysteresis.

FIG. 1 shows a switching regulator 100 in accordance with an example. The example switching regulator 100 includes a coarse control circuit 110, an ADC 115, a delay line pulse width modulator (DLPWM) 120, a transistor driver 130, transistors M1 and M2, an inductor L1, a capacitor C1, and an error amplifier 140. Two or more of the components in FIG. 1 can be fabricated on the same semiconductor substrate (same die). In one example, all components in FIG. 1 are fabricated on the same semiconductor substrate/die. In other implementation example, all components in FIG. 1 except the inductor L1 are fabricated on the same semiconductor substrate.

Transistor M1 is shown in the example of FIG. 1 as an n-type metal oxide semiconductor field effect transistor (NMOS), and transistor M2 is shown as p-type metal oxide semiconductor field effect transistor (PMOS). Different types of transistors can be used in other implementations (e.g., NMOS substituted for PMOS, PMOS for NMOS, bipolar junction transistors instead of MOS transistors, etc.). A transistor has a control input and a pair of current terminals. The control input of a MOS transistor is the gate, and the current terminals are the source and drain. The control input of a bipolar junction transistor is the base, and the current terminals are the emitter and collector.

The switching regulator 100 receives an input voltage VIN and generates a regulated output voltage VOUT. The coarse control circuit 110 receives, as inputs, the input voltage VIN, a target output voltage (Target VOUT), and the time period (Tper) of each cycle of the switching regulator. The coarse control circuit 110 generates a current Iton that encodes the pulse width of a PWM signal (PWM OUT 127) generated by the DLPWM 120 to the driver 130. Iton encodes the length of time that transistor M1 (also referred to as a high side transistor) should be on during each period of the switching regulator's operation. In this example, the ADC 115 is a current ADC which converts the analog Iton current to a digital code shown as CONTROL_COARSE 116 and provided to the DLPWM 120. The ADC 115 includes a hysteresis circuit 700, which is described below.

The DLPWM 120 includes a decoder 121, multiple delay elements 122a, 122b, . . . , 122n (individually and collectively, delay elements 122), and a NAND gate 123. A clock signal (CLOCK) (or other type of trigger signal) is provided to the DLPWM 120 and is delayed by an amount of time that is implemented by the DLPWM 120 based on CONTROL_COARSE 116. The delay elements 122 of the DLPWM 120 are connected in series, and thus each delay element 122 receives the output of the previous delay element, with delay element 122a receiving the clock input CLOCK, and the last delay element 122n providing its output to an input of NAND gate 123. The other input of NAND gate 123 receives the clock input CLOCK. The delay elements 122 generally all implement the same amount of time delay. In one example, the time delay of each delay element is 1.2 nanoseconds (ns). Further, in an example implementation, the DLPWM includes 256 delay elements 122 (n is 256).

The decoder 121 receives CONTROL_COARSE 116 from the ADC 115. CONTROL_COARSE 116 is an m-bit binary value. In one example, m is 8, meaning that CONTROL_COARSE 116 is an 8-bit value. The decoder 121 converts the m-bit value to a multi-bit digital control value in which each control bit 125a-125n is provided to a respective delay element 122. Control bit 125a is provided to delay element 122a, control bit 125b is provided to delay element 122*b*, and so on. Each control bit 125 enables or disables the respective delay element, that is controls whether the respective delay element causes that delay element to delay the signal on its input (from the previous delay element) or to cause the input signal to be provided through to the output of the delay element without any delay being added (bypass mode). For a value of CONTROL_COARSE 116 of S, the first S delay elements in the series chain starting with 122*a* are configured to add delay and the remaining 256-S delay elements 122 are configured for their bypass mode (no additional delay). For example, for a CONTROL_COARSE value of 15 (decimal), the first 15 delay elements starting with 122*a* are configured for a delay, and the remaining 241 delay elements are configured for the bypass mode. In the example in which each of 256 delay elements introduces 1.2 ns of delay and the CONTROL_COARSE 116 can dictate which delay elements provide additional delay and which are configured for the bypass mode, the DLPWM 120 can introduce a total time delay between 1.2 ns and 307.2 ns in 1.2 ns increments.

The output of the NAND gate 123 is the PWM output signal 127 and is provided to driver 130. Driver 130 generates gate drive signals 131 and 132 for the respective transistors M1 and M2. Gate drive signal 131 turns transistor M1 on and off, and gate driver signal 132 turns transistor M2 on and off. The drains of transistors M1 and M2 are connected together at a switch node (SW). Inductor L1 is connected between the switch node SW and capacitor C1. The connection point between inductor L1 and capacitor C1 is the output node 135 of the switching regulator.

VOUT is provided to an input of error amplifier 140 (which implements a gain of G). The other input of error amplifier 140 is the target VOUT voltage. Error amplifier 140 amplifies the difference between the target VOUT voltage and the actual output voltage VOUT from output node 135. In one example implementation, instead of providing VOUT from the output node 135 to the error amplifier, the feedback voltage to the error amplifier is taken from a resistor divider (not shown) connected between the output node 135 and ground, thereby providing a scaled VOUT to the error amplifier. The target VOUT in this example also may be similarly scaled down. The output of error amplifier 140 is CONTROL_FINE 141 and encodes the difference between what VOUT actually is versus what it should be (target VOUT). CONTROL_FINE 141 is a signal provided to each delay element 122 to fine tune the amount of delay introduced by each delay element. In one example, CONLTROL_FINE 141 provides for 50% to 100% adjustment of the nominal 1.2 ns of each delay element 122, resulting in a range of configurable time delay for each delay element of 0.6 ns to 1.2 ns.

Figure 2:
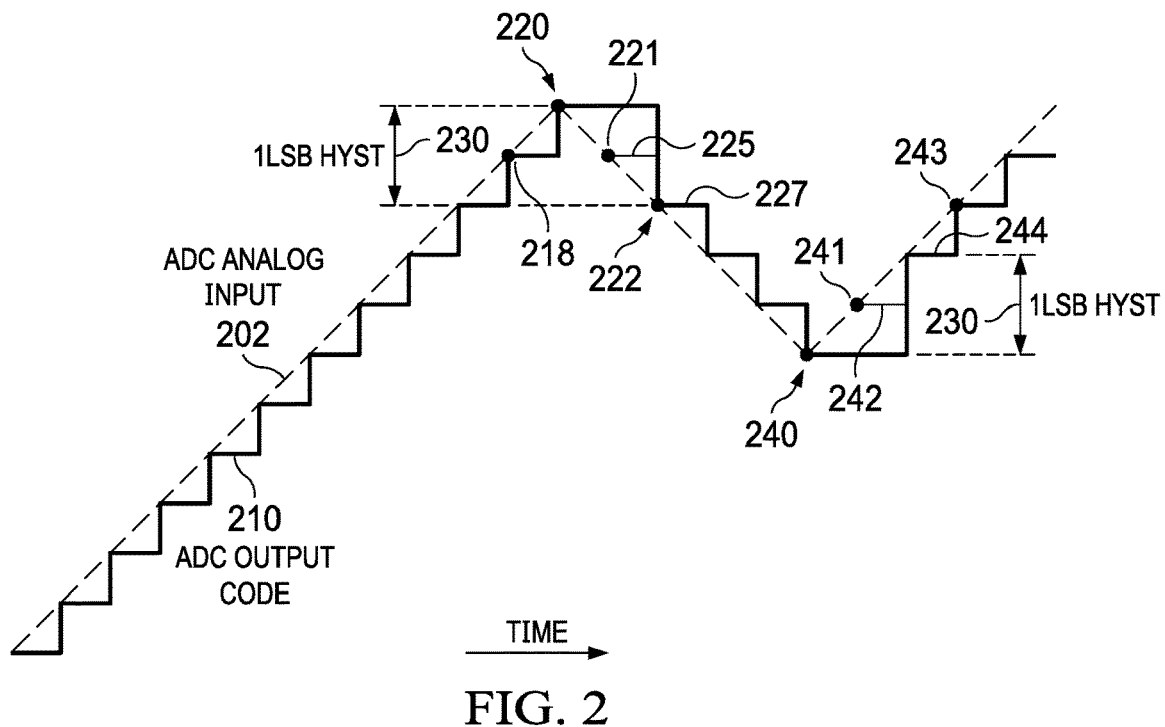
FIG. 2 illustrates the hysteresis principle implemented for the ADC.

The ADC 115 employs hysteresis to produce the output digital code (CONTROL_COARSE). FIG. 2 illustrates an example analog input signal 202 (e.g., Iton) input to the ADC 115 ramping up as shown, along with the upward progression of the corresponding output digital codes 210 (CONTROL_COARSE 116). During the upward progression of the analog input signal 202, the ADC 115 samples the analog input signal and outputs the digital codes corresponding to each sampled input.

At 220, however, the analog input signal 220 changes direction and decreases. The analog input signal 202 increased between samples taken at 218 and 220, but then decreased between the subsequent pair of samples 220 and 221. The ADC 115 determines whether or not to accept and use (e.g., provide to the DLPWM 120) the digital code 225 corresponding to the sample of the analog input signal at 221. In accordance with the example hysteresis technique, a new digital code from ADC 114 is provided as the output digital code (CONTROL_COARSE 116) following the detection of a change in direction of the analog input signal 202 if the new digital code is different from the previous output digital code by more than a hysteresis value. The hysteresis value is preset or configurable into the ADC 115. The hysteresis value is shown at 230 as "1 LSB," which corresponds to an analog signal difference of RANGE/($2^m$), where RANGE is the analog input signal range and m is the number of bits of the digital codes generated by the ADC 115. For example, for an analog input range of 0 A to 5 A (RANGE=5) and a 3-bit ADC 115, 1 LSB corresponds to 0.625 A. In the example of FIG. 2, following the change in direction of the analog input signal 202, the new digital code 225 (corresponding to sample 221 of analog input signal 202) is not more than 1 LSB different (smaller in the example in which the digital codes are decreasing) than previous digital code 220, and thus new digital code 221 is not provided to the DLPWM 120, and digital code 220 continues to be used instead. The next digital code 227 (corresponding to sample 222), however, is at least 1 LSB different (smaller) than the currently used digital code 220, and thus new digital code 227 is provided to, and used by, the decoder 121. The analog input signal 202 again changes direction at 240. Using the same principle described above, the ADC 115 skips the digital code 242 that was generated at sample 241 because digital code 242 is not more than the hysteresis value different (larger in this example in which the digital codes are now increasing) than the currently used code 240. Subsequently, digital code 244 corresponding to sample 243 is determined to be larger than the hysteresis value greater than code 240, and thus is provided to the DLPWM 120.

Figure 3:
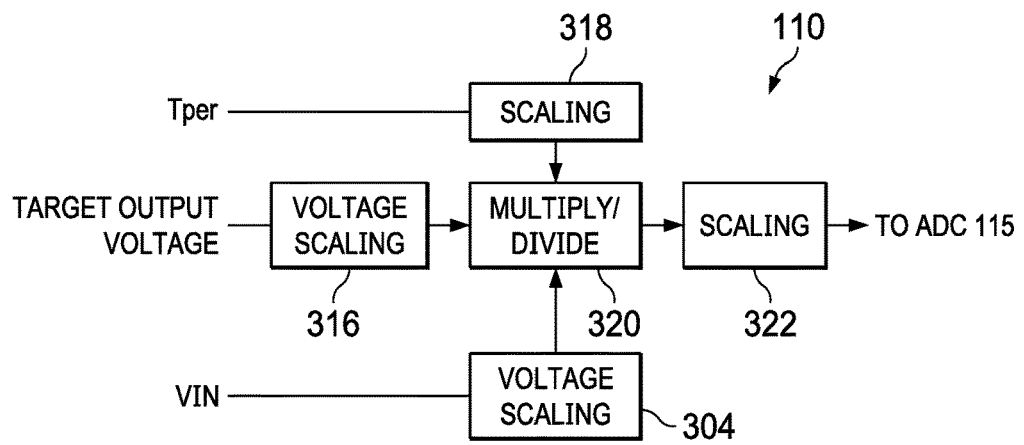
FIG. 3 shows an example implementation of a coarse control circuit used in the switching regulator of FIG. 1.

FIG. 3 is a block diagram of an example of coarse control circuit 110 that generates the Iton current. In the example of FIG. 3, coarse control circuit 110 includes voltage scaling circuits 304, 316, 318, and 322 coupled to a multiply/divide circuit 320. VIN is coupled to voltage scaling circuit 604 that scales the input voltage to a voltage that is compatible with the operating voltages of the coarse control circuit 110. The target output voltage is coupled to voltage scaling circuit 316 which scales the target output voltage to a voltage that is compatible with the operating voltages of the coarse control circuit 110. The Tper input is provided to an input of scaling circuit 318.

The multiply/divide circuit 320 performs the functions on the input signals necessary to generate the output signal. In the example described above, the multiply/divide circuit 320 multiplies Tper (or its scaled value from scaling circuit 318) by the ratio of the target output voltage (or its scaled value) and VIN (or its scaled value). The output of the multiply/divide circuit 320 is transmitted to scaling circuit 322, and scaling circuit 322 scales the output of the multiply/divide circuit 320 appropriately for output to the ADC 115 as Iton.

Figure 4:
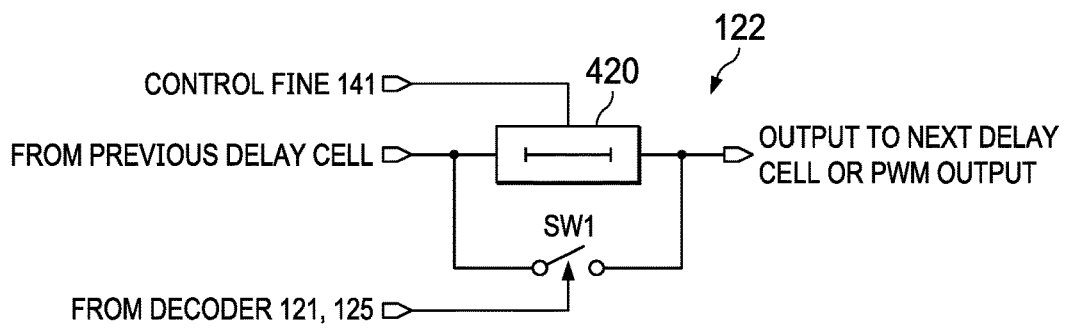
FIG. 4 shows an example implementation of a delay cell used in a delay line pulse width modulator (DLPWM) used in the switching regulator of FIG. 1.

FIG. 4 is a block diagram of an example delay element 122. The example delay cell 122 includes an input that receives the CONTROL_FINE signal 141 described above. An adjustable delay device 420 receives, as its input, the output from the previous delay cell 122. If the delay element 122 is the first delay cell in the series chain of delay cells (e.g., delay element 122*a*), then the input to that delay cell is the dock input CLOCK. In one example, each adjustable, delay device 420 comprises multiple series-connected inverters. Each inverter is characterized by a particular propagation delay, and thus the total propagation delay through the series-connected set of inverters is the sum of the propagation delays through the set of inverters. In one example, the number of inverters is an even number so that the polarity of the output from the adjustable delay device 420 is the same as its input signal.

A switch SW1 is coupled across the adjustable delay device 420. The open/closed state of switch SW1 is controlled by the control bit 125 from the decoder 141, When the switch SW1 is open, the output signal from the delay dement 122 is a delayed version of its input signal. When switch SW1 is dosed (per control bit 125), the input signal to the delay element 122 flows through switch SW1 thereby bypassing the adjustable delay device 420, and thus the output signal from the delay dement 122 is not delayed with respect to the input signal. As explained above, the CONTROL_COARSE signal 116 from the ADC 115 is a binary signal that is decoded by decoder 121 to generate a separate control bit 125 for each delay dement 122. When the control bit is in a first logic state, the respective switch SW1 is open to cause the adjustable delay device 420 to introduce a time delay to the output signal from the previous delay dement. When the control bit is in a second logic state, the respective switch SW1 is dosed to cause the adjustable delay device 420 to be bypassed to thereby avoid introducing a time delay to the output signal from the previous delay dement.

Figure 5:
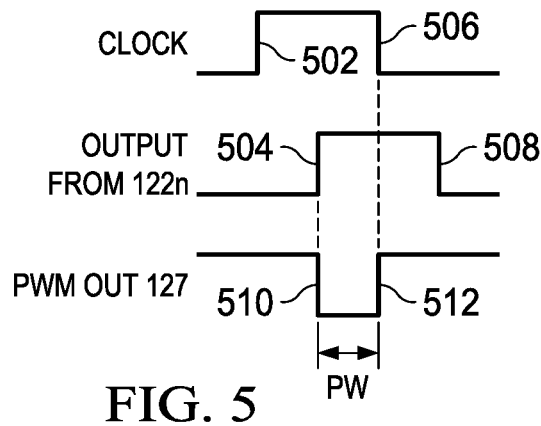
FIG. 5 further illustrates the operation of the DLPWM.

Referring back to FIG. 1, the NAND gate 123 NANDs together the output from the last delay dement 122n and CLOCK. FIG. 5 shows an example period of CLOCK and the output from delay element 122n. CLOCK has a rising edge 502 and a falling edge 504, and the output from delay dement 122n has corresponding rising and falling edges 504 and 506. The time delay between rising edges 502 and 506 is equal to the total delay of all delay elements 122 whose switches SW1 are set to the open state by the control bits 125 from the decoder 121. FIG. 5 also illustrates PWM OUT 127, which is the output signal from NAND gate 123. PWM OUT 127 has a falling edge 510 and a rising edge 512. PWM OUT 127 is logic high when at least one of the NAND gates inputs is logic low. The PWM OUT 127 is logic low when both inputs are logic high. Thus, PWM OUT 127 is logic high until rising edge 504 occurs at which point both CLOCK and the output from delay element 122n are logic high. At that point, PWM OUT 127 becomes logic low and remains logic low until the falling edge 506 of CLOCK. The pulse width (PW) of the negative pulse of PWM OUT 127 is based on when rising edge 504 occurs, which in turn is based on the total time delay configured into the DLPWM by CONTROL_COARSE from the ADC 115.

Figure 6:
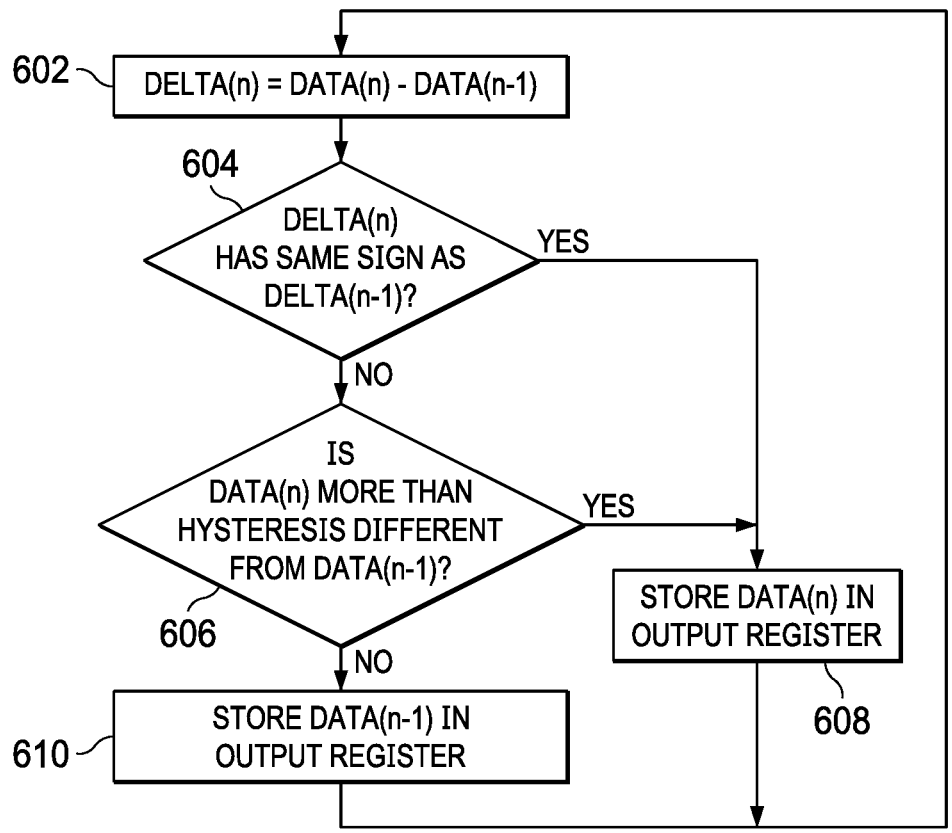
FIG. 6 illustrates an example of a method for employing hysteresis with the ADC.

FIG. 6 illustrates an example method for implementing hysteresis for the ADC 115. At 602, the method includes determining the difference between the current digital code Data(n) (i.e., the most recent digital code generated by the ADC 115) and the previous digital code Data(n−1). The difference is referred to as Delta(n). The difference between Data(n−1) and Data (n−2) is referred as Delta(n−1). The determination of the difference in digital codes includes determining the sign of the difference, that is, determining whether the difference is positive or negative. If the analog input (e.g., Iton) is increasing, the difference in digital codes will be positive, and if the analog input is decreasing, the difference will be negative.

At 604 the method includes determining whether Delta(n) has the same sign as Delta(n−1). If the analog input continues to change in the same direction (be it increasing or decreasing), Delta(n) will have the same sign as Delta(n−1). If the analog input signal changes direction, such as that illustrated at 220 and 240 in FIG. 2, Delta(n) will have the opposite sign as Delta(n−1). If the Delta signs are the same, then the current digital code, Data(n), is stored into an output register within the ADC 115 to subsequently be provided to the DLPWM 120.

If Delta(n) has a different sign than Delta(n−1), then a determination is made at 606 as to whether the current digital code. Data(n), should be stored in the output register, or whether the previous digital code, Data(n−1), should be stored in the output register (or, if Data(n−1) is already in the output register, not overwrite it with a different value). At operation 608. if Data(n) is different from Data(n−1) by more than the hysteresis value, then Data(n) is stored in the output register. Otherwise, at operation 610, if Data(n) is not more than the hysteresis value different than Data(n−1), then Data(n−1) is stored in the output register.

Figure 7:
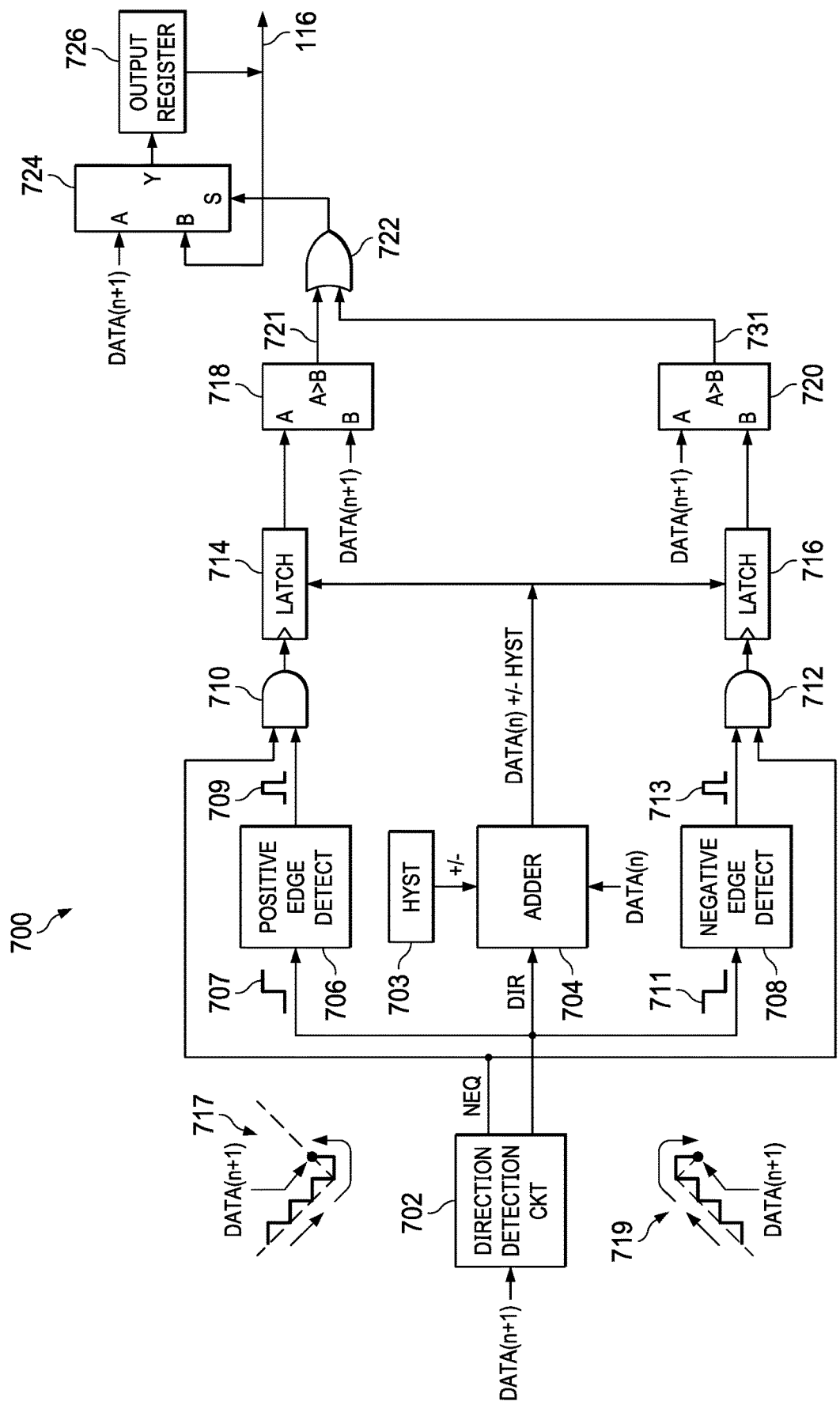
FIG. 7 shows an example of a circuit for employing hysteresis for the ADC.

FIG. 7 shows an example of a hysteresis circuit 700 that implements hysteresis for the ADC 115. Hysteresis circuit 700 may be included as part of ADC 115 (as illustrated in FIG. 1), or as a separate circuit coupled to an output of the ADC 115. Hysteresis circuit 700 in this example includes a direction detection circuit 702, an adder 704, positive and negative edge detectors 706 and 708, AND gates 710 and 712, latches 714 and 716, comparators 718 and 720, multiplexer 724, and output register 726. The input to hysteresis circuit 700 is a stream of digital codes from ADC 115. Data(n+1) represents the analog-to-digital conversion of the most recent sample of the analog input signal, Iton, Data(n) represents the preceding digital code (stored in the output register, Data(n−1) the digital code before Data(n), and so on. The direction detection circuit 702 detects the occurrence of a change in direction of the digital codes (e.g., as shown at 220 and 240 in FIG. 2). The direction detection circuit 702 detects a change in direction in which a new code is smaller but preceding codes had been increasing, as well as a change in direction in which a new code is larger but preceding codes had been decreasing. The direction detection circuit 702 implements the functionality of operation 602 of FIG. 6 (described above).

The direction detection circuit 702 provides two output signals—NOT EQUAL (NEQ) and DIR. NEQ encodes whether Data(n+1) is different than Data(n). For example, NEQ equal to 1 means that Data(n+1) is different than Data(n), whereas NEQ equal to 0 means that Data(n+1) is the same as Data(n). DIR encodes whether Data from the ADC 115 is increasing or decreasing. In one example DIR equal to 0 means that Data is decreasing (e.g., Data(n+1) is smaller than Data(n) and Data(n) is smaller than Data(n−1)), and DIR equal to 1 means that Data is increasing (e.g., Data(n+1) is larger than Data(n) and Data(n) is larger than Data(n−1)).

The inputs to the adder 704 include the previous Data currently stored in the output register 726 (i.e., Data(n)), the DIR signal, and the value of hysteresis (HYST). HYST is stored in a hysteresis storage element 703 (e.g. memory, a register, etc.) which is coupled to the adder 704. The adder 704 either adds the hysteresis value (HYST) to, or subtracts HYST from, Data(n) based on the DIR signal. For example, the adder adds HYST to Data(n) if DIR is a 0 indicative of a decreasing analog input signal, and subtracts HYST from Data(n) if DIR is a 1 indicative of an increasing analog input signal. The output of adder 704 is provided to latches 714 and 716.

The DIR signal from the direction detection circuit 702 is a stream of 0's and 1's indicating whether the data values from the ADC 115 are increasing (e.g., DIR=1) or decreasing (e.g., DIR=0). A change in DIR from 0 to 1 or from 1 to 0 indicates a change in direction. The positive edge detect circuit 706 comprises a one-shot circuit that generates a positive output pulse (illustrated at 709) responsive to a positive edge of the DIR signal (illustrated at 707). Similarly, the negative edge detect circuit 708 also comprises a one-shot circuit that generates a positive output pulse illustrated at 713) responsive to a negative edge of the DIR signal (illustrated at 711). As such, positive edge detect circuit 706 generates an output pulse 709 responsive to Data(n+1) being larger than Data(n) following a previous downward trend in the data values, as illustrated at 717. The negative edge detect circuit 708 generates an output pulse 713 responsive to Data(n+1) being smaller than Data(n) following a previous upward trend in the data values, as illustrated at 719.

AND gate 710 ANDs the output of the positive edge detect circuit 706 with the NEQ signal from the direction detection circuit 702. If NEQ equals 1, then Data(n+1) is different than Data(n) and DIR indicates the direction of the change as noted above. However, if NEQ equals 0, Data(n+1) is the same as Data(n) and the state of DIR should be rejected as the data is neither increasing or decreasing. Thus, AND gate 710 blocks a false positive output pulse 709 from reaching latch 714. Similarly, AND gate 712 ANDs the output of the negative edge detect circuit 708 with the NEQ signal for the same reason.

The output from AND gate 710 is provided to a clock input of latch 714. Upon the occurrence of an edge (rising or falling) of the positive edge detect circuit's output (assuming NEQ=1), the latch 714 latches in the output of Adder 704. Upon a change in direction of the ADC's output data from decreasing to increasing (illustrated at 717), the adder 704 produces an output value to latch 714 that is the sum of the previous data, Data(n), and the hysteresis value. Similarly, the output from AND gate 712 is provided to a clock input of latch 716. Upon the occurrence of an edge (rising or falling) of the negative edge detect circuit's output (assuming NEQ=1), the latch 716 latches in the output of Adder 704. Upon a change in direction of the ADC's output data from increasing to decreasing (illustrated at 719), the adder 704 produces an output value to latch 716 that is the previous data, Data(n), minus the hysteresis value.

When clocked, each latch 714, 716 latches in its input data. Latch 714 provides its latched data to the A input of comparator 718. The B input of comparator 718 comprises the current data value, Data(n+1). The output 721 of comparator 718 is asserted high in this example responsive to the data on the A input being larger than the data on the B input, that is, Data(n)+HYST being larger than Data(n+1). The output 721 of comparator 718 being logic high indicates that, following a downward to upward directional change of the ADC's output data, the new data value, Data(n+1) is not larger than the old value, Data(n) by the hysteresis value. The logic high ("1") from comparator 718 in this example propagates through OR gate 722 to the select (S) input of multiplexer 724 to cause the B input of multiplexer 724 to be provided as its output (Y). The B input of multiplexer 724 receives the previous data value, Data(n), from the output register 726 and thus the data value in the output register 726 remains unchanged (Data(n)). A logic low ("0") from comparator 718 indicates that the new data value, Data(n+1), is more than the hysteresis value greater than Data(n) and causes the S input to multiplexer 724 to select its A input, which receives the current data value, Data(n+1). As such, the output register 726 is updated by multiplexer 724 to the new data value, Data(n+1).

Latch 716 provides its latched data to the B input of comparator 720. The A input of comparator 720 comprises the current data value, Data(n+1). The output 731 of comparator 720 is asserted high in this example responsive to the data on the A input being larger than the data on the B input, that is, when Data(n+1) is larger than Data(n)–HYST. The output 731 of comparator 720 being logic high indicates that, following an upward to downward directional change of the ADC's output data, the new data value, Data(n+1) is not smaller than the old value, Data(n), by the hysteresis value. The logic high from comparator 720 in this example propagates through OR gate 722 to the select (S) input of multiplexer 724 to cause the B input of multiplexer 724 (Data(n)) to be provided as its output (Y) back to the output register 726 and thus the data value in the output register 726 remains unchanged. A logic low from comparator 720 indicates that the new data value, Data(n+1), is more than the hysteresis value smaller than Data(n) and causes the S input to multiplexer 724 to select its A input, which receives the current data value, Data(n+1). As such, the output register 726 is updated by multiplexer 724 to the new data value, Data(n+1). The combination of adder 704, positive and negative edge detect circuits 706, 708, AND gates 710, 712, latches 714, 716, comparators 718, 720, OR gate 722, and multiplexer 724 implements the functionality of operations 606-610 in FIG. 6. The reference to the output register in operations 608 and 610 is output register 726 in FIG. 7.

If no directional change in the ADC data values is present (i.e., the data is increasing or is decreasing), the outputs of the positive and negative edge detect circuits 706, 708 remains low and the outputs of comparators 718 and 720 remain low as well, which causes the output register 716 to be updated with each new data value received by hysteresis circuit 700.

Figure 8:
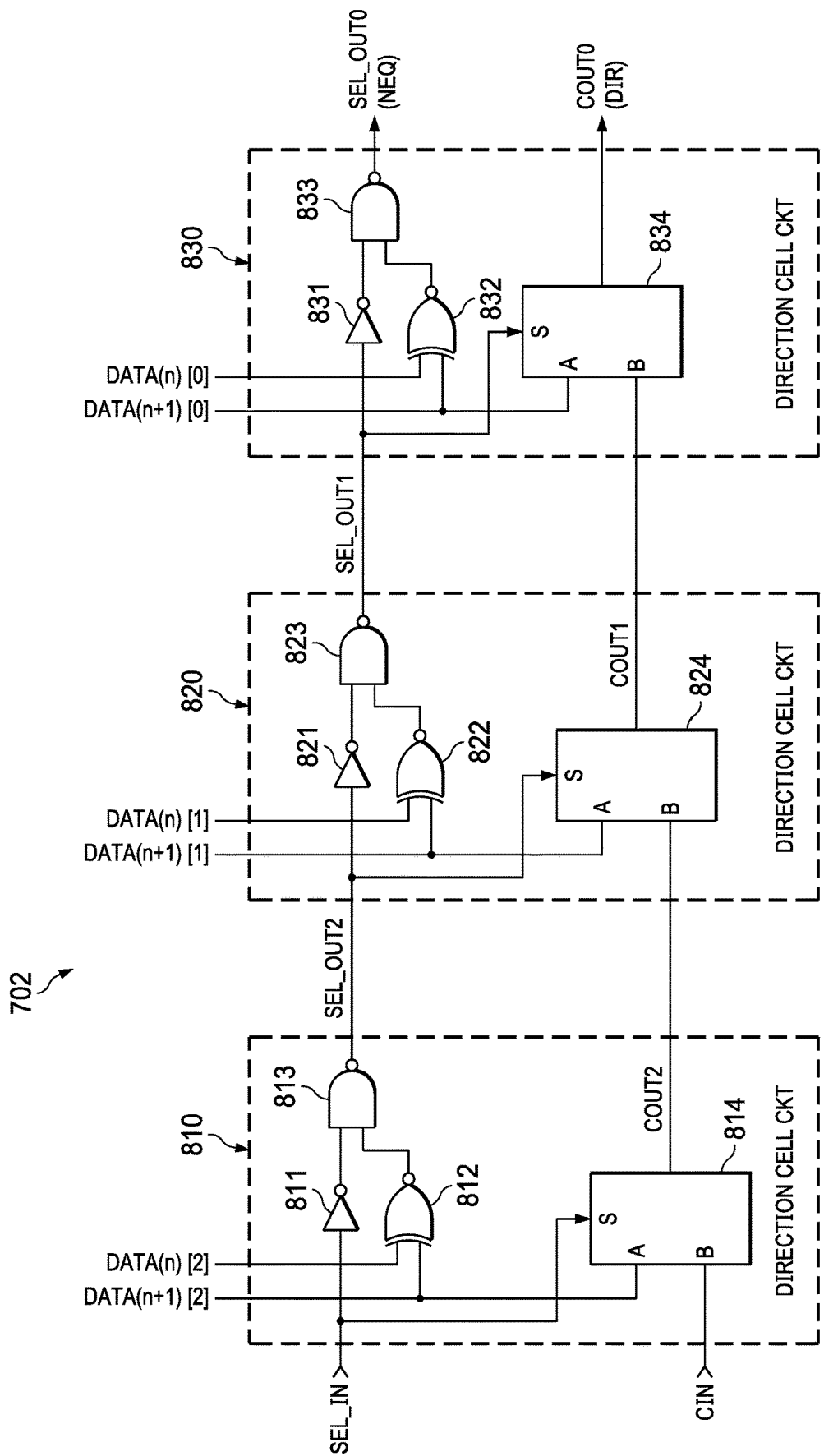
FIG. 8 shows an example of a direction detection circuit usable to employ hysteresis for the ADC.

FIG. 8 illustrates an example implementation of direction detection circuit 702. The example direction detection circuit 702 in this example is a 3-bit circuit meaning that 3-bit digital codes (Data[2:0]) are provided to the direction detection circuit. The direction detection circuit 702 is readily scaled to a larger number of bits as desired. The inputs to the direction detection circuit 702 includes the current digital code from the ADC 115, Data(n+1)[2:0], and the preceding digital code, Data(n)[2:0]. The example direction detection circuit 702 in FIG. 8 includes three direction cell circuits 810, 820, and 830. Direction cell circuit 830 generates the NEQ and DIR signals. Direction cell circuit 810 receives the most significant bits of Data(n+1) and Data(n), that is Data(n+1)[2] and Data(n)[2]. Direction cell circuit 820 receives the next most significant bit of Data(n+1) and Data(n), that is Data(n+1)[1] and Data(n)[1]. Direction cell circuit 830 receives the least significant bit of Data(n+1) and Data(n), that is Data(n+1)[0] and Data(n)[0].

Each direction cell circuit includes a comparator and a combinatorial logic circuit. The combinatorial logic circuit in this example includes an inverter, an exclusive-NOR gate, and a NAND gate. Direction cell circuit 810 includes inverter 811, exclusive-NOR gate 812, NAND gate 813, and comparator 814. Direction cell circuit 820 includes inverter 821, exclusive-NOR gate 822, NAND gate 823, and comparator 824. Direction cell circuit 830 includes inverter 831, exclusive-NOR gate 832, NAND gate 833, and comparator 834. The input to inverter 811 receives a signal designated SEL_IN. The output of the inverter is the logical inverse of SEL_IN and is coupled to one input of NAND gate 813. The two Data inputs to direction cell circuit 810 are provided to the inputs of exclusive-NOR gate 812. The output of exclusive-NOR gate 812 is provided to another input of NAND gate 813. Multiplexer 814 as a selection control input (S) and inputs A and B. The signal on input A receives the most significant bit of Data(n+1) and the input A signal is provided through to the output of the multiplexer 814 when, for example, SEL_IN is 0. When SEL_IN is 1, the signal on input B is provided through to the output of the multiplexer 814. The B input of multiplexer 814 is receives a CIN input signal.

The configurations of direction cell circuits 820 and 830 are the same as for direction cell circuit 810. The Data(n+1)[1] and Data(n)[1] bits are provided to the inputs of exclusive-NOR gate 822 of direction cell circuit 820, and the least significant bits Data(n+1)[0] and Data(n)[0] bits are provided to the inputs of exclusive-NOR gate 832 of direction cell circuit 830. The output of NAND gate 813 of direction cell circuit 810 is labeled SEL_OUT2 and is provided to the inverter 821 of direction cell circuit 820. Similarly, the output of NAND gate 823 of direction cell circuit 820 is labeled SEL_OUT1 and is provided to the inverter 831 of direction cell circuit 830. The SEL_OUT0 output of NAND gate 833 represents the NEQ signal discussed above.

The output of comparator 814 of direction cell circuit 810 is labeled COUT2 and is coupled to the B input of comparator 824 of direction cell circuit 820. The output of comparator 824 of direction cell circuit 820 is labeled COUT1 and is coupled to the B input of comparator 834 of direction cell circuit 830. The COUT0 output of comparator 834 of direction cell circuit 830 is represents the DIR signal discussed above.

During each cycle in which the digital code Data(n+1) is compared to previous digital code Data(n) supplied to the DLPWM 120, SEL_IN and CIN are both initialized to 0. An exclusive-NOR gate outputs a 0 in responsive to its inputs being different and outputs a 1 when its inputs are the same (both 0 or both 1). A NAND gate outputs a 0 only when its inputs both 1. With SEL_IN being a 0, the output of inverter 811 is a 1. If the Data(n+1)[2] bit is the same as the Data(n)[2] bit (both 1 or both 0), then the other input of NAND gate 813 from exclusive-NOR gate 812 also is a 1, and the SEL_OUT2 bit from direction cell circuit 810 is a 0. The same logic is implemented in direction cell circuits 820 and 830 and thus if each bit of Data(n+1)[2:0] is the same as the corresponding bit of Data(n)[2:0], then SEL_OUT0 will be a 0. SEL_OUT0 being a 0 indicates that the new digital code Data(n+1) is the same value as the previous digital code Data(n).

With each SEL_OUT bit being a 0 (in the case in which Data(n+1) equals Data(n), the A input of each multiplexer is selected to be provided through to the output as COUT. The A input receives the Data(n+1) bit of the respective direction cell circuit. As such, the COUT of each direction cell circuit is the Data(n+1) bit for that direction cell circuit as long as the Data(n+1) and Data(n) bits of that direction cell circuit and the more significant bit direction cell circuits are the same.

Starting from the most significant bit direction cell circuit 810 and continuing towards the least significant bit direction cell circuit 830, as long as the Data(n+1) and Data(n) bits for the respective direction cell circuit have the same value, the SEL_OUT bit from that direction cell circuit is 0. If, however, the Data(n+1) and Data(n) bits to a direction cell circuit are different (1 and 0, or 0 and 1), then output of the respective exclusive-NOR gate will be a 0, and thus the output of the respective NAND gate. As such, the first direction cell circuit (starting from the most significant bit direction cell circuit 810) for which the respective Data(n+1) and Data(n) bits are different, causes that direction cell circuit's NAND gate to output a 1 as its SEL_OUT bit. The SEL_OUT bit from each direction cell circuit is used to control the multiplexer of the subsequent direction cell circuit. That is, SEL_OUT2 controls multiplexer 824, and SEL_OUT1 controls multiplexer 834. With a given SEL_OUT being a 1 (due to the respective Data(n+1) and Data(n) bits being different), the B input of the subsequent multiplexer is selected. The B input of the subsequent multiplexer is coupled to the COUT bit of the preceding multiplexer, and thus receives the Data(n+1) of the preceding direction cell circuit. As such, when the input Data(n+1) and Data(n) bits to a give direction cell circuit are different, the SEL_OUT bit of that direction cell circuit causes the subsequent direction cell circuit's multiplexer to select the B input and thus COUT bit of the preceding direction cell circuit. The Data(n+1) bit that fails to be a match to the corresponding Data(n) bit is thus provided through to the next direction cell circuit's multiplexer.

Once a given SEL_OUT bit is a 1, the SEL_OUT bits of the subsequent direction cell circuits are also 1's, and the most significant Data(n+1) bit that failed match its corresponding Data(n) bit is thus propagated through the subsequent set of multiplexers to COUT0. COUT0 thus is the logical state of the most significant Data(n+1) bit that failed match its corresponding Data(n) bit. Moreover, SEL_OUT0 being a 1 indicates that Data(n+1) does not equal Data(n), and COUT0 indicates whether Data(n+1) is bigger or smaller than Data(n).

Figure 9:
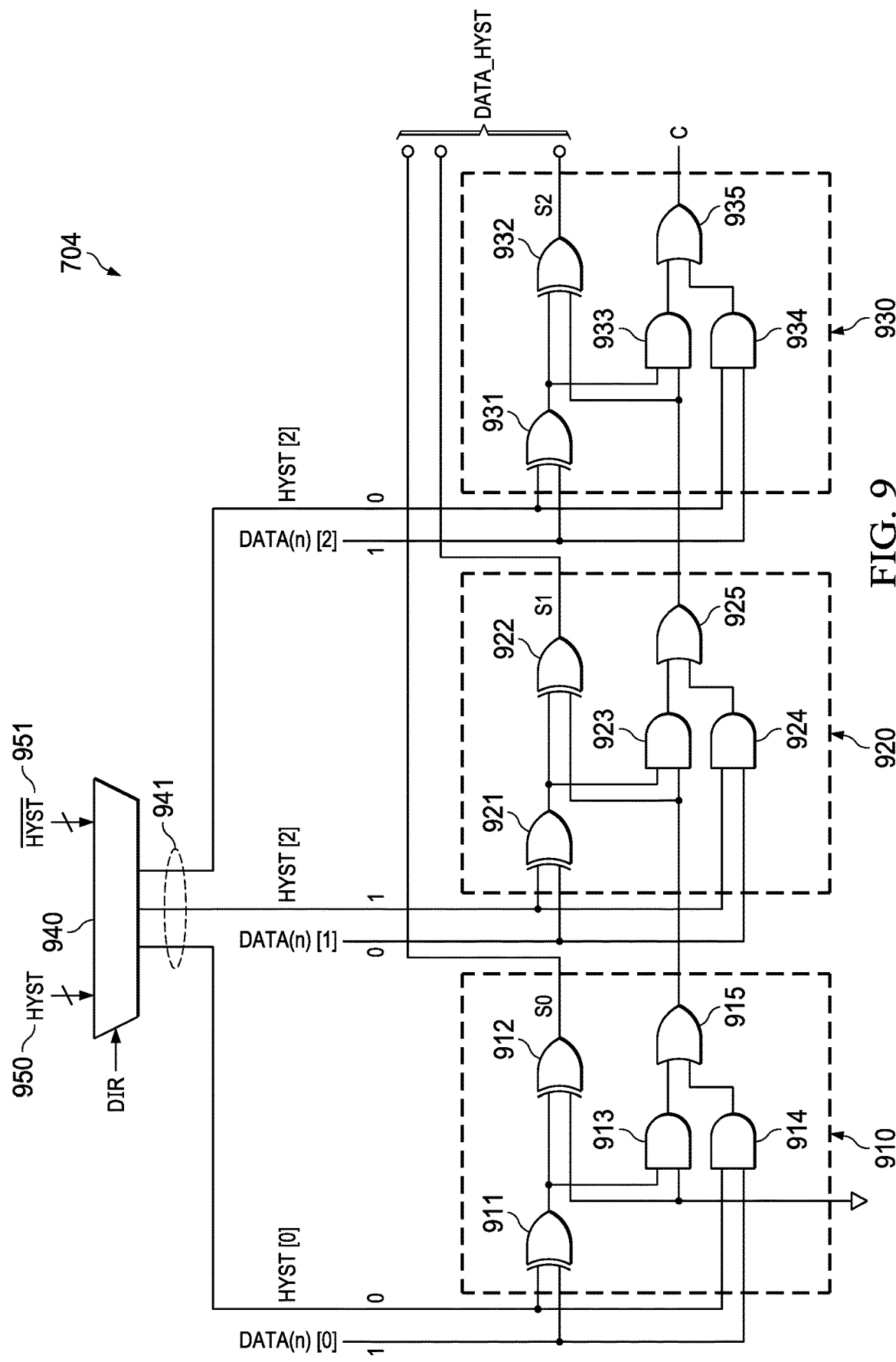
FIG. 9 shows an example of a hysteresis adder usable to employ hysteresis for the ADC

FIG. 9 illustrates an example implementation of adder 704. Depending on the logic level of SIGN, adder 704 adds a hysteresis value (HYST) to, or subtracts HYST from, Data(n). The adder 706 is an n-bit adder. The example adder 704 shown in FIG. 9 is a 3-bit adder which adds a 3-bit Data(n) value to a 3-bit HYST value. Adder 704 includes bit-adders 910, 920, and 930, and a multiplexer 940. The HYST value 950 and its two's-complement 951 are provided to inputs of multiplexer 940, and SIGN selects HYST 950 or its two's-complement to be provided to the bit-adders 910, 920, and 930. Thus, the adder 704 either adds HYST to DATA(n) or adds the two's-complement of HYST to DATA (n). The output 941 from multiplexer is shown HYST[2:0], and that value is the hysteresis value or its two's-complement. In one example, the hysteresis value is configurable and is stored in a register or other storage mechanism. The two's-complement may be determined within the switching regulator 100 and also stored in a register or other storage mechanism. In another example, the amount of hysteresis implemented by the switching regulator for the digital codes from ADC 115 is fixed, and not configurable.

Each bit-adder includes two exclusive-OR gates, two AND gates, and an OR gate. Bit-adder 910 includes exclusive-OR gates 911 and 912, AND gates 913 and 914, and OR gate 915. Exclusive-OR gate 911 receives the least significant bits of DATA(n) and HYST 941. The output of exclusive-OR gate 911 is coupled to an input of exclusive-OR gate 912 and also to an input of AND gate 913. The other inputs of exclusive-ORG ate 912 and AND gate 913 receive a bit value of 0. AND gate 914 also receives the least significant bits of DATA(n) and HYST 941. The outputs of AND gates 913 and 914 are coupled to the inputs of OR gate 914. The output of exclusive-OR gate 912 represents the output sum bit from bit-adder 910, and the output of AND gate 915 represents a carry bit to the next bit-adder (bit-adder 920) in the chain.

Bit-adders 920 and 930 have a similar configuration. Bit-adder 920 includes exclusive-OR gates 921 and 922, AND gates 923 and 924, and OR gate 925. Bit-adder 930 includes exclusive-OR gates 931 and 932, AND gates 933 and 934, and OR gate 935. The outputs of exclusive-OR gates 912, 922, and 932 represent the DATA_HYST value of FIG. 7.

Figure 10:
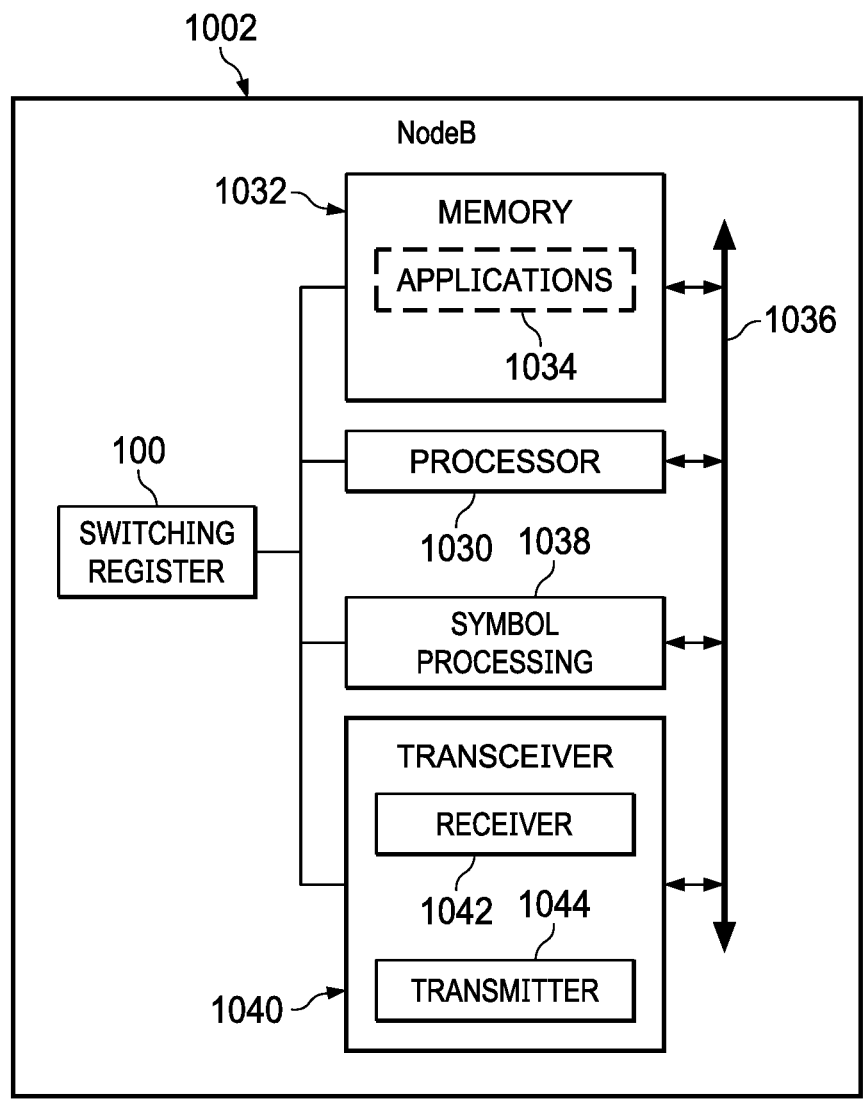
FIG. 10 shows an example of a cellular base station in which the switching voltage regulator can be used.

FIG. 10 shows an example of a base station 1002 in which the switching voltage regular 100 can be used. In this example, the base station 1002 comprises a processor 1030 coupled to a memory 1032, symbol processing circuitry 1038, and a transceiver 1040 via backplane bus 1036. The memory 1032 stores one or more applications 1034 for execution by processor 1030 to manage wireless communications with cellular devices (e.g., cellular phones, tablet devices, etc.).

Transceiver 1040 comprises an uplink Resource Manager, which enables base station 1002 to selectively allocate uplink resources to cellular devices. The components of the uplink resource manager may use the physical (PHY) layer and/or the Media Access Control (MAC) layer of the transceiver 1040. Transceiver 1040 includes one or more receivers 1042 for receiving transmissions from various UEs within range of base station 1002 and one or more transmitters 1044 for transmitting data and control information to the various cellular devices within range of base station 1002. The uplink resource manager executes instructions that control the operation of transceiver 1040. Some of these instructions may be located in memory 1032 and executed when needed by processor 1030. The resource manager controls the transmission resources allocated to each cellular device served by base station 1002.

Symbol processing circuitry 1038 performs demodulation using known techniques. Random access signals are demodulated in symbol processing circuitry 1038.

During transmission and reception of voice data or other application data, receiver 1042 may receive a random access signal from the cellular device. The random access signal is encoded to request a message size compatible with the cellular device. The cellular device determines the message size by using a message threshold provided by base station 1002. The message threshold calculation is implemented by executing instructions stored in memory 1032 by processor 1030. In other examples, the threshold calculation may be implemented by a separate processor/memory unit, by a hardware state machine, or by other types of control logic. Alternatively, in some networks the message threshold is a fixed value that may be stored in memory 1032, for example. In response to receiving the message size request, base station 1002 schedules an appropriate set of resources and notifies the cellular device with a resource grant.

The switching regulator 100 provides one or more regulated supply voltages to one or more the components of the base station 1002 (e.g., the memory 1032, processor 1030, symbol processing 1038, and transceiver 1040. As explained above, the hysteresis circuit 700 reduces the oscillation/ripple in the switching regulator's output voltage that might have otherwise occurred absent the hysteresis circuit. As such, a more stable supply voltage (lower oscillation/ripple) is provided to the components within the base station 1002.

"The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

What is claimed is:

1. A circuit, comprising:
   an analog-to-digital converter (ADC) having an ADC output;
   a direction detection circuit having a direction detection circuit input and a first direction detection circuit output, the first direction detection circuit input coupled to the ADC output;
   an adder having first and second adder inputs and an adder output, the first adder input coupled to the first direction detection circuit output, and the second adder input coupled to a hysteresis storage element;
   a first latch having a first latch input and a first latch output, the first latch input coupled to the adder output; and
   a first comparator having first and second comparator inputs, the first comparator input coupled to the ADC output, and the second comparator input coupled to the first latch output.

2. The circuit of claim 1, further comprising:
   a multiplexer coupled to the first comparator; and
   a register coupled to the multiplexer.

3. The circuit of claim 1, wherein the first latch has a first clock input, and the circuit further comprises:
   a positive edge detect circuit having a positive edge detect input and a positive edge detect output;
   a first logic gate having a first logic gate input and a first logic gate output, the first logic gate input is coupled to the positive edge detect output, and the first logic gate output is coupled to the first clock input.

4. The circuit of claim 1, further comprising:
   a negative edge detect circuit having a negative edge detect input and a negative edge detect output;
   a second logic gate having a second logic gate input and a second logic gate output, the second logic gate input is coupled to the negative edge detect output; and
   a second latch having a second clock input, a second latch input, and a second latch output, the second latch input coupled to the adder output, and the second clock input coupled to the second logic gate output; and
   a second comparator having third and fourth comparator inputs, the third comparator input is coupled to the ADC output, and the fourth comparator input is coupled to the second latch output.

5. The circuit of claim 4, wherein the first comparator has a first comparator output and wherein the second comparator has a second comparator output, the circuit further comprising a third logic gate having third and fourth logic gate inputs, the third logic gate input coupled to the first comparator output and the fourth logic gate input coupled to the second comparator output.

6. A circuit, comprising:
   a coarse control circuit configured to generate an output current based on an input parameter;
   a current analog-to-digital converter (ADC) coupled to an output of the coarse control circuit and configured to convert the output current from the coarse control circuit to a series of digital codes, the current ADC including a register and a hysteresis circuit, the hysteresis circuit is configured to (a) determine that a first digital code of the series of digital codes represents a change in a same direction as previous digital codes and store the first digital code in the register and (b) determine that a second digital code of the series of digital codes represents a change in direction from previous digital codes, determine that the second digital code is less than a hysteresis value different than a preceding digital code, and reject the second digital code;

a pulse width modulator (PWM) coupled to the register of the hysteresis circuit, the PWM having a PWM output;

a first transistor having a first control input;

a second transistor having a second control input; and a driver coupled between the PWM output and the first and second control inputs.

7. The circuit of claim 6, wherein the hysteresis circuit is configured to determine that a third digital code of the series of digital codes represents a change in direction from previous digital codes, determine that the third digital code is at least a hysteresis value different than a preceding digital code, and store the third digital code in the register.

8. The circuit of claim 6, wherein the hysteresis circuit includes:

a register; and a multiplexer having a first input, a second input, and a first output, the first input configured to receive each successive digital code in the series of digital codes, and the first output and the second input are coupled to the register.

9. The circuit of claim 8, wherein the hysteresis circuit includes a direction detection circuit having a direction detection circuit input and a direction detection circuit output, the direction detection circuit input configured to receives the series of digital codes, and the direction detection circuit is configured to generate a direction signal on the direction detection circuit output, the direction signal to indicate whether the digital codes are increasing or are decreasing.

10. The circuit of claim 9, wherein the hysteresis circuit includes a positive edge detect circuit coupled to the direction detection circuit output, and includes a negative edge detect circuit coupled to the direction detection circuit output, and wherein the positive edge detect circuit is configured to generate an output pulse upon detection of a positive edge of the direction signal, and the negative edge detect circuit is configured to generate an output pulse upon detection of a negative edge of the direction signal.

11. The circuit of claim 9, wherein the direction detection circuit includes a plurality of direction cell circuits, each direction cell circuit of the plurality of direction cell circuits including:

a combinatorial logic circuit configured to receive corresponding bits of a digital code of the series of digital codes and a preceding digital code, the combinatorial logic circuit including a combinatorial output coupled to another direction cell circuit; and a third multiplexer having a having a second selection control input coupled to the combinatorial output of another direction cell circuit.

12. The circuit of claim 6, wherein the hysteresis circuit includes an adder configured to add the hysteresis value to a digital code within the series of digital codes, the adder having an adder output.

13. The circuit of claim 12, wherein the hysteresis circuit includes a latch coupled to the adder output, the latch is configured to latch data from the adder output responsive to an output pulse from the positive edge detect circuit.

14. The circuit of claim 6, wherein the PWM comprises a delay line PWM including a first delay element and a second delay element, wherein, based on the digital codes from the register, the delay line PWM is configured to separately enable and disable the first and second delay elements.

15. A circuit, comprising:

an analog-to-digital converter (ADC) configured to generate a series of digital codes; and a hysteresis circuit configured to:

determine that a first digital code of the series of digital codes represents a change in a same direction as previous digital codes and store the first digital code in a register; and determine that a second digital code of the series of digital codes represents a change in direction from previous digital codes, determine that the second digital code is less than a hysteresis value different than a preceding digital code, and not store the second digital code in the register.

16. The circuit of claim 15, wherein the hysteresis circuit is configured to determine that a third digital code of the series of digital codes represents a change in direction from previous digital codes, determine that the third digital code is at least a hysteresis value different than a preceding digital code, and store the third digital code in the register.

17. The circuit of claim 15, wherein the hysteresis circuit includes a direction detection circuit having a direction detection circuit input and a direction detection circuit output, the direction detection circuit input configured to receives the series of digital codes, and the direction detection circuit is configured to generate a direction signal on the direction detection circuit output, the direction signal to indicate whether the digital codes within the series of digital codes are increasing or decreasing.

18. The circuit of claim 17, wherein the hysteresis circuit includes an adder configured to, depending on an output signal from the direction detection circuit, add the hysteresis value to, or subtract the hysteresis value from, a digital code within the series of digital codes.

19. The circuit of claim 17, wherein the hysteresis circuit includes a positive edge detect circuit coupled to the direction detection circuit output, and includes a negative edge detect circuit coupled to the direction detection circuit output, and wherein the positive edge detect circuit is configured to generate an output pulse upon detection of a positive edge of the direction signal, and the negative edge detect circuit is configured to generate an output pulse upon detection of a negative edge of the direction signal.

20. The circuit of claim 15, wherein the hysteresis circuit includes an adder configured to, depending on whether the digital codes with the series of digital codes are increasing or decreasing, add the hysteresis value to, or subtract the hysteresis value from, a digital code within the series of digital codes, the adder having an adder output.

* * * * *